United States Patent
Koike et al.

(10) Patent No.: US 7,902,504 B2
(45) Date of Patent: Mar. 8, 2011

(54) CHARGED PARTICLE BEAM REFLECTOR DEVICE AND ELECTRON MICROSCOPE

(75) Inventors: Hirotami Koike, Itabashi-ku (JP); Shinichi Okada, Itabashi-ku (JP)

(73) Assignee: Kabushiki Kaisha TOPCON, Tokyo (JP)

( * ) Notice: Subject to any disclaimer, the term of this patent is extended or adjusted under 35 U.S.C. 154(b) by 214 days.

(21) Appl. No.: 12/285,673

(22) Filed: Oct. 10, 2008

(65) Prior Publication Data
US 2009/0095904 A1    Apr. 16, 2009

(30) Foreign Application Priority Data
Oct. 12, 2007    (JP) ................. 2007-266053

(51) Int. Cl.
H01J 3/16 (2006.01)
H01J 37/12 (2006.01)
H01J 37/26 (2006.01)

(52) U.S. Cl. ........ 250/306; 250/310; 250/311; 250/396 R

(58) Field of Classification Search .................. 250/306, 250/310, 311, 396 R
See application file for complete search history.

(56) References Cited

U.S. PATENT DOCUMENTS
| 5,319,207 | A | 6/1994 | Rose et al. |
| 7,714,285 | B2* | 5/2010 | Barnard ......................... 250/306 |
| 2010/0065753 | A1* | 3/2010 | Enyama et al. ............... 250/397 |

FOREIGN PATENT DOCUMENTS
JP    3269575    1/2002

* cited by examiner

Primary Examiner — Nikita Wells
(74) Attorney, Agent, or Firm — Wenderoth, Lind & Ponack, L.L.P.

(57) ABSTRACT

A charged particle beam reflector device is configured to include at least two electrostatic mirrors arranged with a predetermined interval on a linear optical axis, each having a through hole through which a charged particle beam radiated from an electron gun along a linear optical axis passes, and having a function of reflecting the charged particle beam or allowing the charged particle beam to pass through the through hole in accordance with an applied voltage, and a controller controlling an applied voltage to the at least two electrostatic mirrors. The controller applies, to each of the electrostatic mirrors, a reflection voltage allowing the electrostatic mirrors to reflect the charged particle beam at a predetermined timing so that the charged particle beam from the electron gun is reflected by the at least two electrostatic mirrors a plurality of times.

12 Claims, 4 Drawing Sheets

CHARGED PARTICLE BEAM REFLECTOR DEVICE AND ELECTRON MICROSCOPE

CROSS REFERENCE TO RELATED APPLICATIONS

The present application is based on and claims priority from Japanese Patent Application No. 2007-266053, filed on Oct. 12, 2007, the disclosure of which is hereby incorporated by reference in its entirety.

BACKGROUND OF THE INVENTION

1. Field of the Invention

The present invention relates to a charged particle beam reflector which can correct chromatic aberration and spherical aberration of a lens system, and to an electron microscope incorporating the charged particle beam reflector.

2. Description of the Related Art

Generally, an electron beam used in an electron microscope has a wavelength of 0.024 Å when the acceleration voltage is 200 kV, for example. It is theoretically possible to increase a resolution of an electron microscope to the order of the wavelength of the electron beam; however, in practice a resolution of the electron microscope is 1.9 Å at most owing to chromatic aberration and spherical aberration of a lens system.

It is known that the chromatic aberration and spherical aberration of the lens system can be corrected by use of an electrostatic mirror. Japanese Laid-open Patent Application Publication No. Hei 5-205687 discloses an electron microscope including an electrostatic mirror to correct the chromatic aberration and spherical aberration of the lens system. Such an electron microscope comprises a beam deflector as a part of the imaging system and the electrostatic mirror to deflect an electron beam at 90 degrees by the beam deflector, reflect the deflected electron beam by the electrostatic mirror, and deflect the reflected electron beam at 90 degrees again by the beam deflector. In such a manner, it returns the electron beam to the original optical axis.

However, there is a problem in such an electron microscope that since the electron beam is deflected at 90 degrees by the beam deflector, electric and magnetic fields of the beam are both not rotationally symmetric, and the fringing effect of both fields is likely to cause an asymmetric high-order aberration.

Particularly, the high-order aberration occurring in reality and that theoretically obtained do not always coincide with each other, so that it is hard to suppress the high-order aberration and improve the resolution of the electron microscope to the order of the wavelength of the electron.

SUMMARY OF THE INVENTION

In view of solving the above problem, an object of the present invention is to provide a charged particle beam reflector device which can correct the chromatic aberration and spherical aberration of a lens system without causing high-order aberration due to the fringing effect, and to provide an electron microscope incorporating such a charged particle beam reflector device.

According to one aspect of the present invention, a charged particle beam reflector device comprises: at least two electrostatic mirrors arranged with a predetermined interval on a linear optical axis, each having a through hole through which a charged particle beam radiated from a charged particle beam source along the linear optical axis passes, and having a function of either of reflecting the charged particle beam and allowing the charged particle beam to pass through the through hole in accordance with an applied voltage; and a voltage controller controlling an applied voltage to the at least two electrostatic mirrors, in which the voltage controller applies a reflection voltage to each of the electrostatic mirrors at a predetermined timing so that the charged particle beam from the charged particle beam source is reflected by the at least two electrostatic mirrors at least more than once, the reflection voltage allowing the electrostatic mirrors to reflect the charged particle beam, numbers of times of the reflections by the respective electrostatic mirrors being the same.

Preferably, in such a charged particle beam reflector device, one of the electrostatic mirrors is a first electrostatic mirror which is disposed on a side of the charged particle beam source, and the other of the electrostatic mirrors is a second electrostatic mirror facing the first electrostatic mirror. Further, the voltage controller is configured to apply a pass voltage to the first electrostatic mirror at a first timing, applies a second reflection voltage to the second electrostatic mirror at a second timing, and applies a first reflection voltage to the first electrostatic mirror at a third timing, the pass voltage allowing the first electrostatic mirror to have the charged particle beam pass therethrough, the first and second reflection voltage allowing the first and second electrostatic mirrors to reflect the charged particle beam, respectively. The second timing is set to come before the charged particle beam having passed through the through hole of the first electrostatic mirror applied with the pass voltage at the first timing reaches the second electrostatic mirror. The third timing is set to come before the charged particle beam reflected by the second electrostatic mirror reaches the first electrostatic mirror, and the charged particle beam from the charged particle beam source is reflected by the first and second electrostatic mirrors at least more than once, numbers of times of the reflections by the first and second electrostatic mirrors being the same.

Preferably, such a charged particle beam reflector device further comprises a decelerator around an outer periphery of each of the electrostatic mirrors, to decelerate the charged particle beam.

According to another aspect of the present invention, an electron microscope comprises the above charged particle beam reflector device, a charged particle beam source radiating a charged particle beam along a linear optical axis, a convergent lens, and an objective lens.

Preferably, the electron microscope is set so that the charged particle beam is radiated as a pulse from the charged particle beam reflector device, in which the electron beam scans via the objective lens with a scan period and a blanking period, and a period in which the pulse is not outputted and the blanking period are made coincident with each other.

DETAILED DESCRIPTION OF THE PREFERRED EMBODIMENT

Hereinafter, embodiments of an electron microscope comprising a charged particle beam reflector device according to the present invention will be described in detail with reference to the accompanying drawings.

First Embodiment

Figure 1:
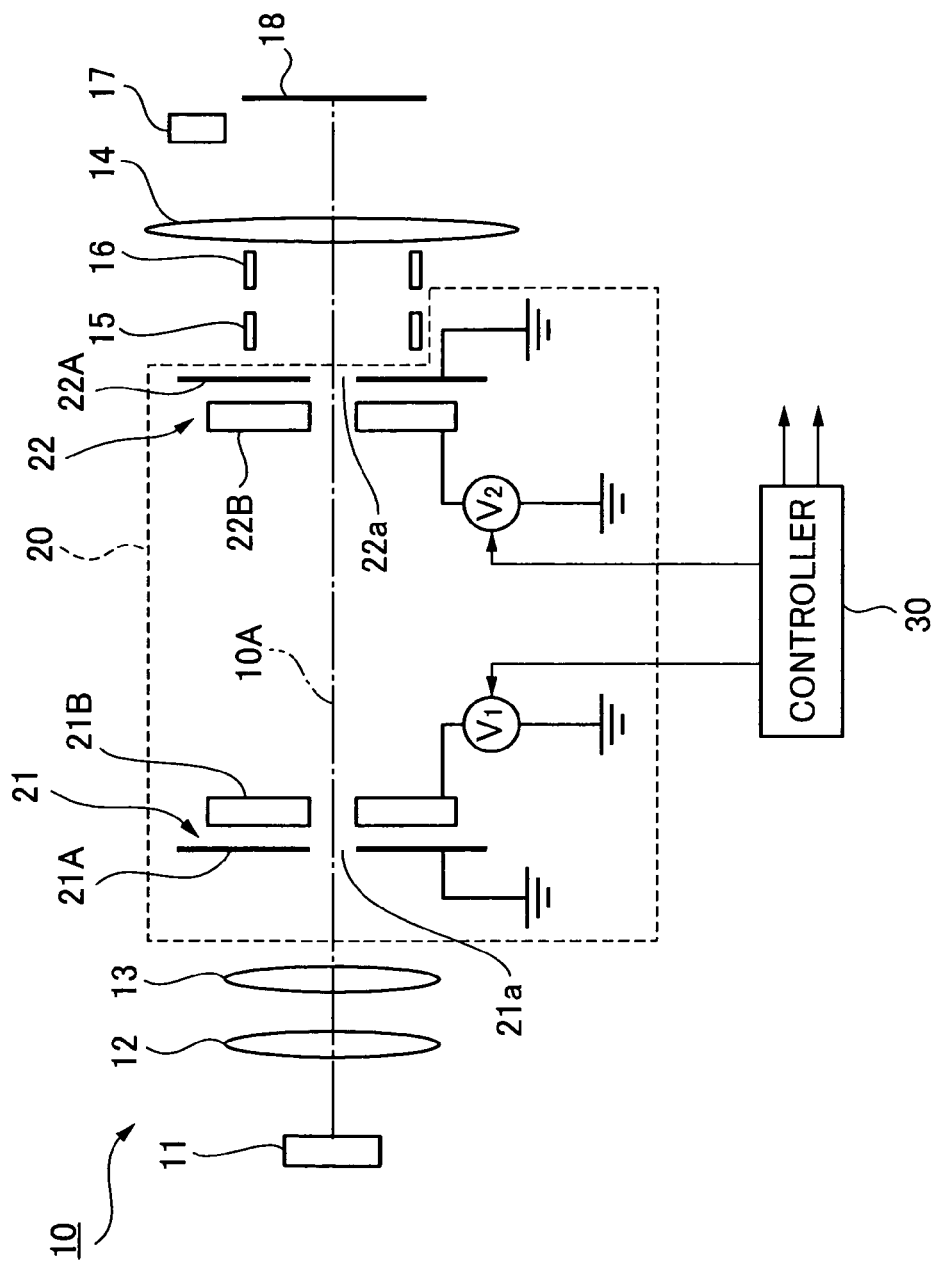
FIG. 1 shows a structure of an electron microscope according to a first embodiment of the present invention.

FIG. 1 shows a scan type electron microscope 10. The electron microscope comprises an electron gun (charged particle beam source) 11 radiating an electron beam as a charged particle beam along a linear optical axis 10A, a first convergent lens 12 and a second convergent lens 13 converging the radiated electron beam, an objective lens 14 irradiating an electron beam to a specimen 18, a charged particle beam reflector 20 provided between the second convergent lens 13 and the objective lens 14, polarizers 15, 16 provided between the charged particle beam reflector 20 and the objective lens 14 for scanning with the electron beam, and a secondary electron detector 17 provided between the specimen 18 and the objective lens 14.

The electron gun 11 radiates an electron beam at an acceleration voltage of 1 to 3 kV, for example.

The charged particle beam reflector 20 includes first and second electrostatic mirrors 21, 22 which are disposed on the linear optical axis 10A with a predetermined interval.

The first electrostatic mirror 21 includes a first electrode 21A on a side of the electron gun 11, a second electrode 21B applied with a voltage of a lower potential than that of the first electrode 21A, and a through hole 21a formed through the first and second electrodes 21A, 21B and through which the charged particle beam radiated along the linear optical axis 10A passes. Likewise, the second electrostatic mirror 22 includes a first electrode 22A, a second electrode 22B applied with a voltage of a lower potential than that of the first electrode 22A, and a through hole 22a formed through the first and second electrodes 22A, 22B and through which the charged particle beam radiated along the linear optical axis 10A passes. The first and second electrodes of the first and second electrostatic mirrors 21, 22 face each other. Note that the first electrodes 21A, 22A can be grounded.

A controller 30 controls applied voltages to the first and second electrostatic mirrors 21, 22. The controller 30 and charged particle beam reflector 20 constitute the charged particle beam reflector device.

Next, the operation of the electron microscope 10 as configured above will be described with reference to a timing chart in FIG. 2.

An electron beam as charged particles is radiated from the electron gun 11, travels along the linear optical axis 10A, and passes through the first and second convergent lenses 12, 13. Before the electron beam reaches the first electrostatic mirror 21 of the charged particle beam reflector 20 (first timing), the controller 30 applies a pass voltage V1T whose absolute value is smaller than an acceleration voltage value to the first electrostatic mirror 21 to have the electron beam pass through the through hole 21a thereof.

Before the electron beam having passed through the through hole 21a reaches the second electrostatic mirror 22 (second timing), the controller 30 applies a reflection voltage V2R whose absolute value is larger than an acceleration voltage value to the second electrostatic mirror 22 to have the electron beam reflected by the second electrostatic mirror 22.

Then, before the electron beam reflected by the second electrostatic mirror 22 reaches the first electrostatic mirror 21 (third timing), the controller 30 applies a reflection voltage V1R whose absolute value is larger than an acceleration voltage value to the first electrostatic mirror 21 to have the electron beam reflected by the first electrostatic mirror 21.

Before the electron beam reflected by the first electrostatic mirror 21 reaches the second electrostatic mirror 22 (fourth timing), the controller 30 applies a pass voltage V2T whose absolute value is smaller than an acceleration voltage value to the second electrostatic mirror 22 to have the electron beam pass through the through hole 22a thereof.

Figure 2:
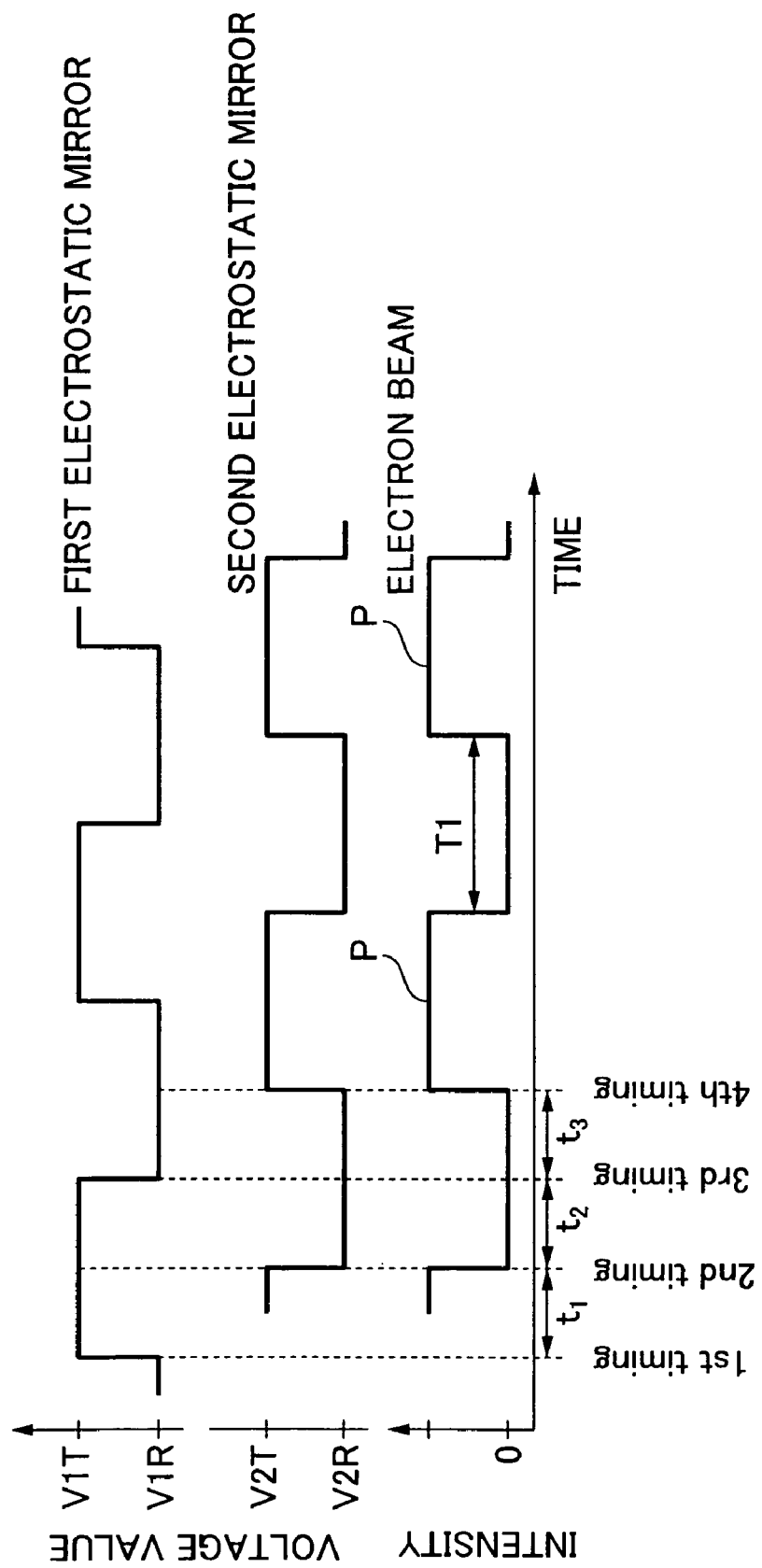
FIG. 2 is a timing chart for operation of a charged particle beam reflector in FIG. 1.

Through repetition of a series of operation above, the electron beam is emitted from the charged particle beam reflector 20 in a pulse P form with a predetermined cycle, as shown in FIG. 2.

In FIG. 2, time t1 represents a time from the electron beam's having passed through the first electrostatic mirror 21 to its reaching the second electrostatic mirror 22, a time t2 represents a time from the electron beam's being reflected by the second electrostatic mirror 22 to its reaching the first electrostatic mirror 21, a time t3 represents a time from the electron beam's being reflected by the second electrostatic mirror 22 to its reaching the first electrostatic mirror 21. The times t1 to t3 change depending on the distance between the first and electrostatic mirrors 21, 22 and energy of the electron traveling therebetween. The unit of the times t1 to t3 is picosecond or nanosecond, for example.

In the timing chart of FIG. 2, the first electrostatic mirror 21 is applied with the pass voltage V1T between a first timing and a third timing while the second electrostatic mirror 22 is applied with the reflection voltage V2R between a second timing and a fourth timing. The voltage applied to the first and second electrostatic mirrors 21, 22 is continuous, however, it can be intermissive (pulsing).

The applied voltage to the polarizers 15, 16 is controlled at a timing at which the electron beam (pulse P) is emitted from the charged particle beam reflector 20, in accordance with the pulse width of the electron beam. The electron beam scans the specimen 18 via the objective lens 14. That is, the applied voltage to the polarizers 15, 16 is controlled so that the width of the pulse P and a horizontal scan period is made coincident with each other, and a period T1 between two pulses P is made coincident with a blanking period of the horizontal scan. Thereby, the electron beam can scan the specimen 18 efficiently.

Here, in the charged particle beam reflector 20 the electron beam is merely reflected in parallel by the first and second electrostatic mirrors 21, 22 so that rotational symmetry of the electrostatic mirrors can be maintained. Because of this, it is possible to correct the chromatic aberration and spherical aberration of the objective lens 14 or the like by the reflection by the first and second electrostatic mirrors without the high-order aberration caused by the fringing effect.

The faster the electron travels, the larger the amount it travels until it reaches the electrostatic mirror and is reflected thereby. Such an electron will be more greatly affected by action of the electrostatic mirror, resulting in correcting the chromatic aberration.

The spherical aberration can be corrected with use of the electrostatic mirror by making the electron beam reflected by the electrostatic mirror incident on the objective lens 14 or the like and canceling out a negative spherical aberration by the electrostatic mirror and a positive spherical aberration by the objective lens 14.

According to the first embodiment, the electron beam is reflected by each of the first and second electrostatic mirrors 21, 22 at once. Alternatively, it can be reflected by each of them at plural times.

Second Embodiment

Figure 3:
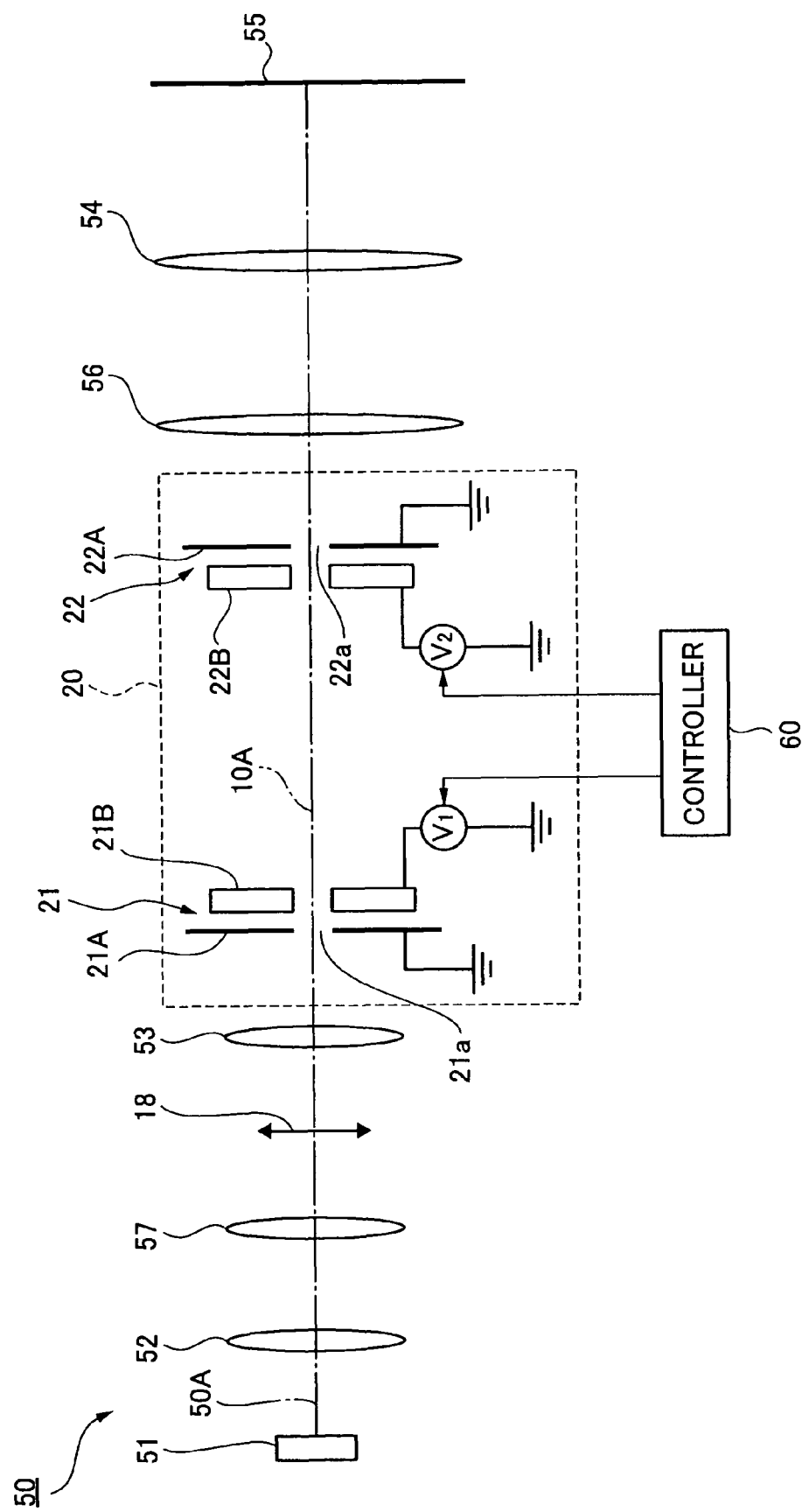
FIG. 3 shows a structure of an electron microscope according to a second embodiment of the present invention.

FIG. 3 shows a transmission-type electron microscope 50 incorporating a charged particle beam reflector device. The electron microscope 50 comprises an electron gun 51 radiating an electron beam as charged particle beam along a linear optical axis 50A, a first convergent lens 52 and a second convergent lens 57 converging the radiated electron beam, an objective lens 53, an intermediate lens 56, a projector lens 54, a fluorescent plate 55, and a charged particle beam reflector 20 provided between the objective lens 53 and the intermediate lens 56. Note that the fluorescent plate 55 can be a CCD detector.

In FIG. 3, the charged particle beam reflector 20 as an electrostatic mirror correction system is disposed between the objective lens 53 and the intermediate lens 56, however, it can be disposed between the intermediate lens 56 and the projector lens 54.

Similarly to the first embodiment, a period between two pulses is set to coincide with the blanking period of the electron, when there is a blanking period. This enables efficient irradiation of the electron beam to the specimen 18.

The electron microscope 50 can correct the chromatic aberration and spherical aberration of the objective lens 53 without causing high-order aberration due to the fringing effect, as in the first embodiment

Third Embodiment

Figure 4:
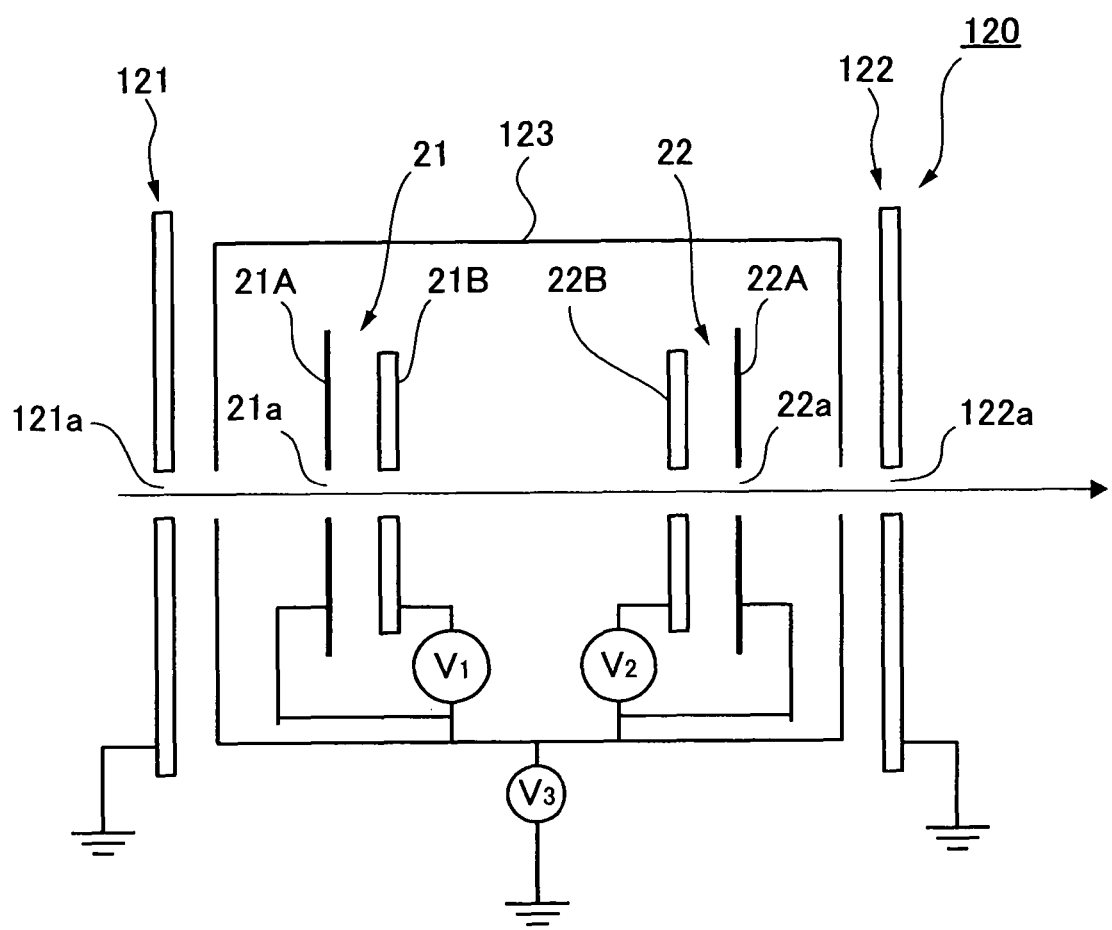
FIG. 4 shows a structure of an electron microscope according to a third embodiment of the present invention.

FIG. 4 shows the structure of another example of a charged particle beam reflector 120. The charged particle beam reflector 120 additionally comprises, around the outer periphery of the first and second electrostatic mirrors 21, 22, a decelerator 123 (FIG. 4) decelerating the speed of an electron passing through the electrostatic mirror system by making the entire mirror system have a negative potential. Disposed ahead and behind the decelerator 123 are an earth electrode 121 with a through hole 121a through which the electron beam passes and an earth electrode 122 with a through hole 122a through which the electron beam passes, respectively.

The decelerator 123 is preferably configured to be applied with a constant voltage V3 whose potential is substantially equal to that of the acceleration voltage of the electron guns 11, 51, thereby to make the potential of the entire mirror system substantially equal to that of the acceleration voltage. This makes it possible to achieve a reflex action of the first and second electrostatic mirrors 21, 22 at a lower voltage and to heighten the speed of reflection and traveling of the electron beam by the first and second electrostatic mirrors.

The above embodiments have described an example where two-stage electrostatic mirrors are used, however, the present invention is not limited thereto. Electrostatic mirrors in three or more stages can be also used to reflect the electron beam three times or more.

Further, the first and second electrostatic mirrors are each configured to include a single electrode. However, they can be configured to have a plurality of electrodes, or an electrode which generates a superimposed magnetic field.

The position of the charged particle beam reflector 20 in the electron microscope is not limited to the position shown in FIGS. 1, 3. It can be disposed at any position. However, it is preferable to dispose it at a position closest to the objective lens so as to correct the aberration thereof most effectively.

Moreover, there is a known aberration corrector with a multi-pole (hexapole, for example). The charged particle beam reflector device according to the present invention can be combined with a hexapole. The level of accuracy required for the corrector using a multi-pole to correct the chromatic aberration is higher by one digit than to correct the spherical aberration. Therefore, the charged particle beam reflector device can be combined with the multi-pole to correct the chromatic aberration by the charged particle beam reflector device and correct the spherical aberration by the corrector with the multi-pole.

As described in the above embodiments, advantageously, the charged particle beam reflector device according to the present invention is configured to include at least the first and second electrostatic mirrors with the through holes so as to achieve the function of reflecting the charged particle beam or allowing it to pass through the through holes. With such configuration, it can correct the chromatic aberration and the spherical aberration separately without causing the high-order aberration due to the fringing effect.

The above embodiments have described an example of using an electron beam for the charged particle, however, the present invention is not limited thereto. Proton beam or ion beam is also applicable. With use of a positively charged particle beam such as proton beam, the second electrodes 21B, 22B of the first and second electrostatic mirrors 21, 22 need to be set to have a positive potential higher than that of the first electrodes 21A, 22A.

The above embodiments have described a charged particle beam reflector device which is incorporated into a scan or transmission type electron microscope. However, the present invention is not limited thereto. It is also applicable to a semiconductor manufacture/inspection device using a charged particle beam, an electron beam exposure device, an ion implanter or the like.

Although the present invention has been described in terms of exemplary embodiments, it is not limited thereto. It should be appreciated that variations may be made in the embodiments described by those skilled in the art without departing from the scope of the present invention as defined by the following claims.

What is claimed is:

1. A charged particle beam reflector device comprising:
    at least two electrostatic mirrors arranged with a predetermined interval on a linear optical axis, each having a through hole through which a charged particle beam radiated from a charged particle beam source along the linear optical axis passes, and having a function of either of reflecting the charged particle beam and allowing the charged particle beam to pass through the through hole in accordance with an applied voltage; and
    a voltage controller controlling an applied voltage to the at least two electrostatic mirrors, wherein
    the voltage controller applies a reflection voltage to each of the electrostatic mirrors at a predetermined timing so that the charged particle beam from the charged particle beam source is reflected by the electrostatic mirrors at least more than once, the reflection voltage allowing the electrostatic mirrors to reflect the charged particle beam, numbers of times of the reflections by the respective electrostatic mirrors being the same.

2. A charged particle beam reflector device according to claim 1, wherein:
    one of the electrostatic mirrors is a first electrostatic mirror which is disposed on a side of the charged particle beam source;
    the other of the electrostatic mirrors is a second electrostatic mirror facing the first electrostatic mirror;
    the voltage controller is configured to apply a pass voltage to the first electrostatic mirror at a first timing, applies a second reflection voltage to the second electrostatic mirror at a second timing, and applies a first reflection voltage to the first electrostatic mirror at a third timing, the pass voltage allowing the first electrostatic mirror to have the charged particle pass therethrough, the first and second reflection voltages allowing the first and second electrostatic mirrors to reflect the charged particle beam, respectively;

the second timing is set to come before the charged particle beam having passed through the through hole of the first electrostatic mirror applied with the pass voltage at the first timing reaches the second electrostatic mirror;

the third timing is set to come before the charged particle beam reflected by the second electrostatic mirror reaches the first electrostatic mirror; and the charged particle beam from the charged particle beam source is reflected by the first and second electrostatic mirrors at least more than once, numbers of times of the reflections by the first and second electrostatic mirrors being the same.

3. A charged particle beam reflector device according to claim 2, further comprising a decelerator around an outer periphery of the first and second electrostatic mirrors, the decelerator decelerating the charged particle beam.

4. An electron microscope comprising:
the charged particle beam reflector device according to claim 2;
a charged particle beam source radiating a charged particle beam along a linear optical axis;
a convergent lens; and
an objective lens.

5. An electron microscope according to claim 4, further comprising a decelerator around an outer periphery of the first and second electrostatic mirrors, the decelerator decelerating the charged particle beam.

6. An electron microscope according to claim 4, wherein the electron microscope is set so that the charged particle beam is radiated as a pulse from the charged particle beam reflector device; the electron beam scans via the objective lens with a scan period and a blanking period; and a period in which the pulse is not outputted and the blanking period are made coincident with each other.

7. An electron microscope according to claim 5, wherein the electron microscope is set so that the charged particle beam is radiated as a pulse from the charged particle beam reflector device; the electron beam scans via the objective lens with a scan period and a blanking period; and a period in which the pulse is not outputted and the blanking period are made coincident with each other.

8. A charged particle beam reflector device according to claim 1, further comprising a decelerator around an outer periphery of the electrostatic mirrors, the decelerator decelerating the charged particle beam.

9. An electron microscope comprising:
the charged particle beam reflector device according to claim 1;
a charged particle beam source radiating a charged particle beam along a linear optical axis;
a convergent lens; and
an objective lens.

10. An electron microscope according to claim 9, further comprising a decelerator around an outer periphery of the electrostatic mirrors, the decelerator decelerating the charged particle beam.

11. An electron microscope according to claim 9, wherein:
the electron microscope is set so that the charged particle beam is radiated as a pulse from the charged particle beam reflector device; the electron beam scans via the objective lens with a scan period and a blanking period; and a period in which the pulse is not outputted and the blanking period are made coincident with each other.

12. An electron microscope according to claim 10, wherein the electron microscope is set so that the charged particle beam is radiated as a pulse from the charged particle beam reflector device; the electron beam scans via the objective lens with a scan period and a blanking period; and a period in which the pulse is not outputted and the blanking period are made coincident with each other.

* * * * *